United States Patent [19]
Dickinson

[11] Patent Number: 5,459,414
[45] Date of Patent: Oct. 17, 1995

[54] ADIABATIC DYNAMIC LOGIC

[75] Inventor: Alexander G. Dickinson, Neptune, N.J.

[73] Assignee: AT&T Corp., Murray Hill, N.J.

[21] Appl. No.: 69,926

[22] Filed: May 28, 1993

[51] Int. Cl.$^6$ .................................................... H03K 17/16
[52] U.S. Cl. ............................................. 326/93; 326/98
[58] Field of Search ................... 307/443, 446, 307/448, 451, 452, 480, 481; 326/93, 95, 98, 133

[56] References Cited

U.S. PATENT DOCUMENTS

| | | | |
|---|---|---|---|
| 4,985,643 | 1/1991 | Proebsting | 307/443 |
| 5,121,003 | 6/1992 | Williams | 307/452 |
| 5,208,490 | 5/1993 | Yetter | 307/452 |

OTHER PUBLICATIONS

"High Speed Dynamic Circuits Implemented with GaAs Mesfets", L. Yang, et al. GaAs IC Symposium 1987, pp. 261–264.

"Low-Power CMOS Digital Design", A. P. Chandrakasan, et al., IEEE Journal of Solid-State Circuits, vol. 27, No. 4, Apr. 1992, pp. 473–484.

"Reversible Electronic Logic Using Switches", R. C. Merkle, Early Draft Version, dated Sep. 29, 1992, alleged Xerox Copyright 1990, pp. 1–32.

"Adiabatic Switching, Low Energy Computing and the Physics of Storing and Erasing Information", J. G. Koller, et al., USC Information Sciences Institute, Aug. 5, 1992, pp. 1–5.

"Hot-Clock nMOS", C. L. Seitz, et al., 1985 Chapel Hill Conference on VLSI, pp. 1–17.

"Practical Implementation of Charge Recovering Asymptotically Zero Power CMOS", S. G. Younis, et al., Artificial Intelligence Laboratory, Massachusetts Institute of Technology, Oct. 9, 1992, pp. 1–15.

*Primary Examiner*—David R. Hudspeth
*Attorney, Agent, or Firm*—Eugene S. Indyk

[57] ABSTRACT

A novel family of adiabatic dynamic logic gates can have power*delay products at least an order of magnitude or more below that which was possible in previous families of logic gates. No complex circuitry or unusually configured devices are needed to implement this logic family. In particular, this logic family requires fewer devices and less area per logic gate as compared with ordinary CMOS logic circuitry. This is unlike previous reversible logic proposals which required large numbers of transistors per gate. This logic circuitry can operate from very low supply voltages and need not be optimized for a particular voltage. This logic does not suffer from crowbar currents usually found in prior circuitry such as CMOS logic. Logic levels are regenerated at nearly every stage unlike some previous schemes which reduce energy dissipation only by sacrificing logic levels. At each stage in a calculation, this logic recovers a substantial amount of the energy used to perform the calculation and returns it to the power supply.

19 Claims, 7 Drawing Sheets

ADIABATIC DYNAMIC LOGIC

CROSS-REFERENCE TO RELATED APPLICATIONS

Application Ser. No. 08/069,944 of John S. Denker, entitled Adiabatic Dynamic Noninverting Circuitry, filed on the same day this application is being filed.

Application Ser. No. 08/069,945 of John S. Denker, entitled Adiabatic Dynamic Precharge Boost Circuitry, filed on the same day this application is being filed.

1. Technical Field

This invention relates to logic circuitry. More specifically, this invention relates to logic circuitry having low power consumption and simplified topology.

2. Background

In standard logic circuitry, such as static and dynamic CMOS logic, nodes are charged and discharged in a completely irreversible, dissipative manner, using a switch to charge a node to a first potential and to discharge the node to a second potential. It has been proposed to attach such a node to a slew rate limited clock which in theory gradually, adiabatically, and reversibly charges and discharges the node. Logic circuitry using this technique is currently too complicated and uses too many transistors so that at normal speeds of operation any power savings for each transistor may be lost by the fact that many more transistors are used to accomplish simple logical operations. In addition, it has not been possible to completely avoid nonadiabatic transitions in some prior designs. The total power consumption of the entire circuit thus may not be much less than that used by nonadiabatic circuitry.

SUMMARY

Applicants has developed a logic family based upon dynamic logic gates which are operated adiabatically without substantial energy dissipative transitions. Each member of the family uses a small number of transistors so that the reduced power consumption achieved through the use of adiabatic operation is not lost because of a need for a large number of devices which dissipate energy at normal speeds.

In accordance with one example of the invention, an electronic circuit includes an input node and an output node. The input node carries signals varying between two potentials in an adiabatic fashion without substantial dissipative energy losses. The output node carries corresponding output signals varying between two potentials in a similar adiabatic fashion. The nature of the signals carried by the input and output nodes is such that they may signify at least two possible logical states. The electronic circuit in accordance with this example of the invention also has a clock node which may be connected to an energy source which produces a clock signal varying between two potentials in an adiabatic fashion. The electronic circuit also contains a means for selectively permitting current flow between the clock node and the output node to selectively charge the output node during predetermined portions of the clock signal in response to the state of the output signal. This means also selectively prevents current flow between the output node and the clock node to selectively prevent discharge of the output node in response to the state of the input signal. The input signal is prevented from making transitions between potentials at certain times in the cycle of the clock signal to preserve the adiabatic nature of the electronic circuit. Complete logic families have been developed based upon the concepts described above.

In accordance with another example of this invention, an N-input logic gate may be implemented by using only N+1 transistors or N transistors and a diode. Topologies in accordance with this example of the invention are superior to all competing logic families, unlike previous adiabatic logic proposals which called for impractically large numbers of transistors per gate.

Reduced power consumption by up to an order of magnitude or more may be achieved as compared with prior logic circuitry. Logic circuitry in accordance with this invention also regenerates logic levels at nearly every stage. This is unlike some previous schemes, for example, pass gate schemes, which reduce power dissipation only by sacrificing logic levels between stages.

Adiabatic computing using logic circuitry in accordance with this invention is expected to have a great impact on a wide range of applications from battery powered products to high performance systems where power dissipation is an important consideration.

DETAILED DESCRIPTION

Figure 1:
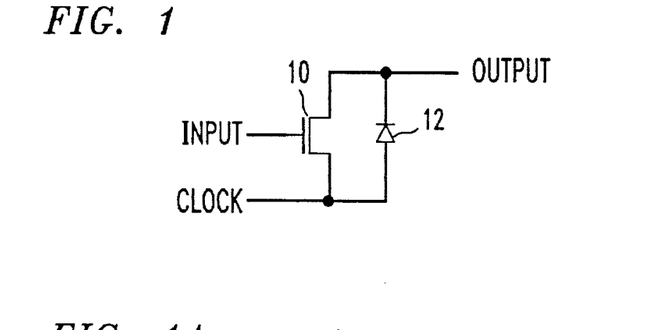
FIG. 1 is a schematic diagram of an example of an adiabatic dynamic inverter in accordance with this invention using an n-channel transistor.
Figure 2:
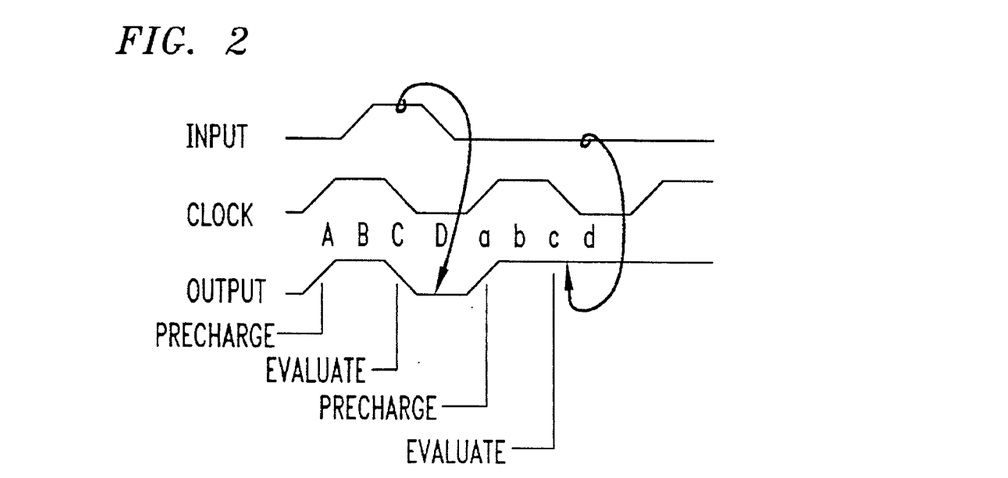
FIG. 2 is a timing diagram showing the input, the output, and the clock voltages applied to the inverter of FIG. 1.

FIG. 1 shows one example of a dynamic logic gate in accordance with this invention. The gate shown in FIG. 1 is a dynamic inverter and comprises a logic element in the form of a controllable switch, such as an n-channel FET 10 normally used in conventional CMOS circuitry. The gate or control terminal of the FET 10 represents an input node which is connected to a signal source which produces an input signal which may have one of two potential levels representing two possible logic states. Transitions between logic states may involve transitions between the two predetermined potential levels. As shown in FIG. 2, the input signal may make transitions between the two logic states adiabatically, namely, at a reduced voltage rate of change which minimizes energy dissipation in the circuit of FIG. 1. Specifically, a signal or a node in this invention makes an adiabatic transition from one state to another state when the energy dissipated in the apparatus which causes the transition is substantially smaller than the energy difference between the two states. For example, if the energy difference between one logic level and another logic level is $½ CV^2$, where C is the effective capacitance associated with a node and V is the voltage or potential change taking place as a result of the node making a transition from one logic level to another logic level, the transition from one logic level to another is adiabatic if substantially less than $½ CV^2$, such as $¼ CV^2$ to as low as $⅟_{20} CV^2$ or less, is dissipated in connection with making the transition.

One output terminal of the FET 10 comprises a clock node which is connected to a clock signal produced by an energy source not shown in FIG. 1. As shown in FIG. 2, the clock signal varies between two states or potential levels. Like the input signal variations, the clock signal variations occur at an adiabatic reduced rate of change to minimize energy dissipation in the circuit of FIG. 1. Another output terminal of the FET 10 represents an output node of the inverter of FIG. 1. The output node carries output signal which has one of two possible logic states. Like the input signal, transitions of the output signal between states involves transitions between two predetermined potential levels. Transitions between levels occurs in a nondissipative adiabatic fashion similar to that occurring in connection with transitions of the input signal and the clock signal. A diode 12 is connected across the output terminals of the FET 10 as shown in FIG. 1. Although FIG. 1 shows the controllable switch as being an FET 10, any controllable switch, such as an NPN or PNP bipolar transistor, may be used in a corresponding circuit configuration to achieve the function of an inverter in accordance with this invention.

FIG. 2 is a timing diagram illustrating the operation of the logic gate of FIG. 1. When a signal appearing at the input terminal of the logic gate is at a high level, which can be a substantially constant voltage level or potential of a predetermined magnitude, the signal appearing at the output terminal of the logic gate is at a low level, specifically in this example, a series of low-going pulses. Conversely, when a signal appearing at the input terminal of the logic gate is at a low level, for example, the input signal comprises a series of low going pulses, the signal appearing at the output terminal is at a high level, specifically, a constant high voltage level or potential.

FIG. 2 illustrates the nature of the adiabatic clocking signal applied to the logic gate of FIG. 1. The clocking signal is a repetitive signal having a predetermined period T. The clocking signal begins at a low level and increases gradually to a high level during a precharge phase labeled A in FIG. 2. The clock then remains at a high level for a certain period of time labeled B in FIG. 2. This period of time can be any predetermined amount of time, even zero. The clock signal then gradually returns to a low level during an evaluation period labeled C in FIG. 2. The clock signal remains at a low level during a predetermined time period labeled D in FIG. 2, after which the previously described cycle is repeated during a succeeding time period labeled abcd in FIG. 2. Although a trapezoidally shaped clock signal is shown here, it could be just as easily a similarly shaped waveform such as a sinusoidal waveform. An advantage of a sinusoidal waveform is that it may easily be produced by conventional LC oscillator circuitry.

A logic circuit such as the one shown in FIG. 1 may be approximated a simple series resistance-capacitance (RC) circuit in analyzing its response to switching signals such as the clock signal shown specifically in FIG. 2. If a signal applied to the circuit of FIG. 1, such as this clock signal, makes a rapid change from one voltage level to another voltage level, then a large voltage spike will appear across the series resistance in the RC circuit immediately after the voltage change. This voltage spike is gradually reduced over time due to the charging or discharging of the series capacitance in the RC circuit. Because of the voltage across the resistance, power is irretrievably dissipated in that resistance during the voltage spike. If the signals in the circuit of FIG. 1 could be slew rate limited to such an extent that the voltage across the capacitance could closely track the changes in the switching voltage, then the power dissipation through the resistance can be minimized. Accordingly, the slope of the signals in the circuit of FIG. 1, such as the clocking signal during the precharge and evaluation phases, is such that the circuit of FIG. 1 operates in an adiabatic fashion. Specifically, the slopes are gradual enough so that capacitances associated with the circuit of FIG. 1 are able to charge and discharge in substantial conformance with the changing voltage signals. For example, the time for the clock or other changing signal to reach a high state from a low state, or vice versa, ("the ramp time") may be greater than the time constant of the previously mentioned RC circuit. In one particular example of this invention, the ramp time may be at least ten times the time constant. This will mean that there are minimal voltages appearing across resistances found in the charging and discharging paths connected to the clocking signal. This also will mean that there is minimal energy dissipation during the charging and discharging created by the operation of the clocking signal. This will ensure that state transitions on the input and output nodes of the circuit of FIG. 1 will be adiabatic, namely, the energy dissipated in the apparatus will be substantially less than the energy difference between the two states.

The timing diagram of FIG. 2 demonstrates the operation of the logic gate of FIG. 1 when the signal on the input terminal changes from a high level to a low level. When the input signal is high, the output closely follows the clock signal. This low going oscillation of the output signal with the clock signal represents a low output from the gate of FIG. 1. When the input signal goes low, the output signal remains high and does not follow the oscillations of the clock signal.

In specific terms, during the precharge phase A, if the output was at a high potential level prior to the precharge phase A, it will remain at that high potential level. Otherwise, it will be dragged up to that high level from a lower level by the clock, via a series connection between the clock node, the diode 12 and the output node. During phase B, the output is kept at a high level. In the evaluation phase C, if the input is high, the transistor 10 will be turned on and the output will be dragged down to its low level by the clock. On the other hand, if the input voltage is low during the evaluation phase C, the transistor 10 will be cut off, the diode will be reverse biased, and the potential of the output node will stay at a high level. In phase D, the output voltage holds the appropriate valid logic level provided the input remains either valid or inactive.

In the circuit of FIG. 1, the diode 12 in parallel with the FET 10 comprises a means which selectively permits current flow between the clock node and the output node of the inverter in response to the nature of the output signal appearing on the output node. Specifically, if the output node is not charged just prior to the precharge phase, then the diode 12 connects the clock node to the output node and causes the clock to precharge the output node adiabatically as the clock voltage rises during the precharge phase. If the output node already has been charged, then the output node is not charged. The diode 12 and the FET 10 together selectively disconnect the output node from the clock node to prevent discharge current to flow from the output node to the clock node to prevent the output node from discharging. This prevention of discharge is in response to the nature of the input signal appearing on the input node. If the input signal is high during the evaluation phase, the FET 10 is in conduction and the output node will discharge adiabatically through the FET 10 in conformance with the reduction in magnitude of the clock signal during the evaluation phase. If the input signal is low during the evaluation phase, the FET 10 will be cut off and the diode 12 will be reversed biased thereby preventing the output node from discharging and following the decrease in the clock voltage during the evaluation phase. Alternatively stated, the FET 10 and the diode 12 will discharge the output node in FIG. 1 from a rest state selectively as a direct and immediate function of the state of a signal carried by the input node. The FET 10 and the diode 12 will thereafter recharge the output node to the rest state selectively as a substantially exclusive function of the state of a signal carried by the output node. This recharging thus is a simple, substantially direct and local function of the state of the output node in FIG. 1.

In order to preserve as much of the adiabatic nature of logic circuitry such as the inverting gate shown in FIG. 1, the input signals are substantially prevented from making sudden transitions from one state to another. They are also prevented from making any state changes during predetermined portions of the clock signal of FIG. 1. For example, the input signals may be constrained to make transitions from one logic state to another logic state during the previously described rest period of the clock signal. Most preferably, the signals in circuits in accordance with this invention are only allowed to change from one potential to another such that a switch does not close when there is substantial voltage across the switch and a switch does not open when there is substantial current is flowing through it. If this rule is followed, then in some instances it is not required to greatly limit the rate of change of certain signals to preserve the adiabatic nature of the operation of that circuitry. For example, if the input signals to a controlled switch, such as the FET 10 in FIG. 1, are constrained to change state only when there is no voltage across the output terminals of those switches, such as the drain and source terminals of the FET 10, then there does not have to be a great deal of restriction on the rate of change of those input signals for adiabatic operation to be preserved.

The circuit of FIG. 1 may have no direct connections to a power supply voltage $V_{dd}$ or ground; it may be powered entirely from a clock wire. The circuit of FIG. 1 cannot possibly suffer from crowbar currents often experienced in CMOS circuitry when complementary transistors used in that circuitry are simultaneously partially in conduction. It outputs good, solid logic levels. Its output is pulled to an active level through a fully turned on transistor and is pulled to an inactive level by the diode 12. This is a large advantage as compared with some previous low power logic proposals (e.g., pass gate schemes) which reduce dissipation only by sacrificing logic levels.

Figure 1A:
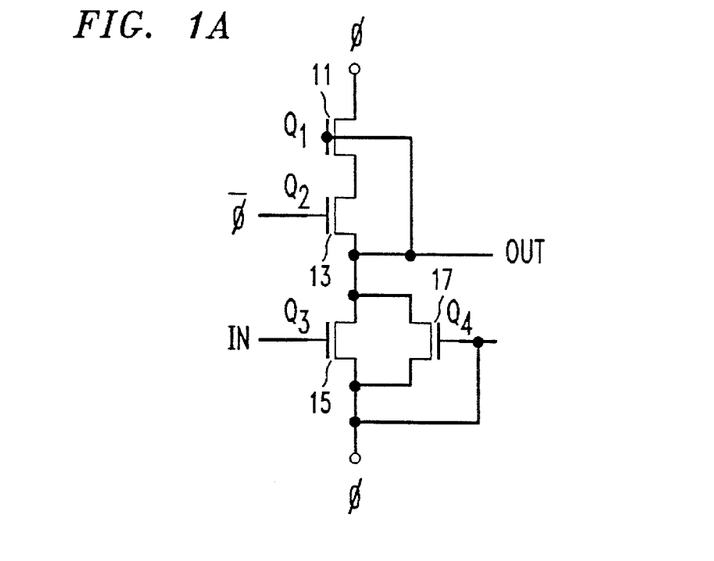
FIG. 1a is a schematic diagram of another example of an adiabatic dynamic inverter in accordance with this invention.

FIG. 1a shows an additional embodiment of an adiabatic inverting gate in accordance with this invention. This gate has an input node and an output node as well as a clock node connected to a clock signal Φ as in FIG. 1. The embodiment of FIG. 1a also includes a P-channel transistor 11 configured to perform the functions of the diode 12 in FIG. 1. As in FIG. 1, this diode checks that the output of the gate in FIG. 1a is low before the gate tries to do a precharge of the output node. The circuit of FIG. 1a includes an N-channel transistor 13 which ensures that the output node and the clock node are disconnected before the clock begins its evaluation descent. The control terminal of this transistor 13 is connected to the inverse of the clock signal Φ. An N-channel transistor 15 corresponds to the transistor 10 shown in FIG. 1. An additional N-channel transistor 17 is configured as an additional diode connected to assist early precharging of the output node.

Figure 3:
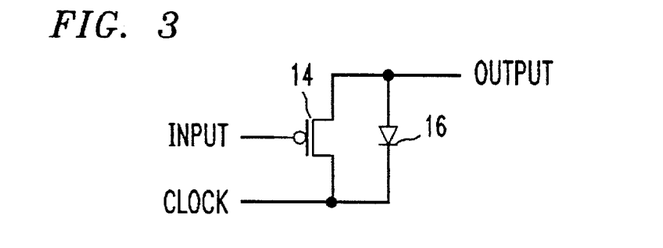
FIG. 3 is a schematic diagram of a p-channel version of the inverter shown in FIG. 1.
Figure 7:
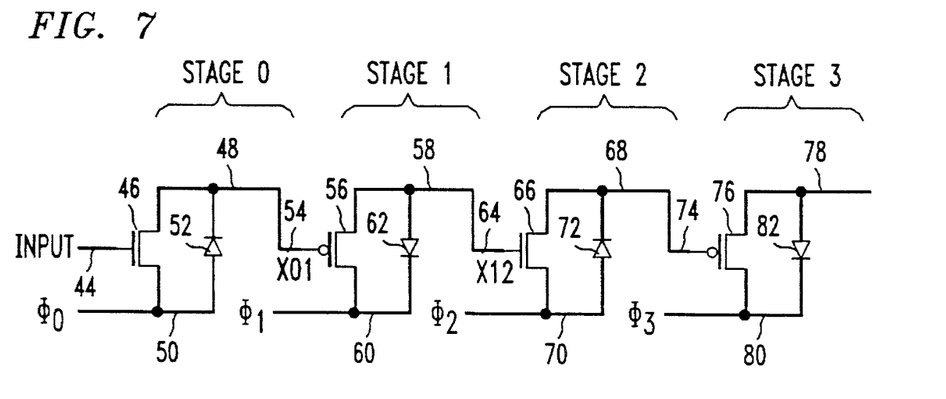
FIG. 7 is a schematic diagram of a multiple stage adiabatic dynamic logic circuit in accordance with this invention.

FIG. 3 illustrates another version of the inverter shown in FIG. 1. The inverter of FIG. 3 uses a controllable switch in the form of a p-channel FET 14 and a diode 16 which is connected to the clock node and the output node in a direction opposite to that of the diode 12 in the inverter of FIG. 1. As shown in FIG. 7 below, it is convenient that there be alternative versions of a logic gate such as an inverter involving controllable switches of two conductivity types, such as p-channel and n-channel FETs, in order to create a versatile logic family. This facilitates creating sequences of gates useful in logic circuitry.

Figure 4:
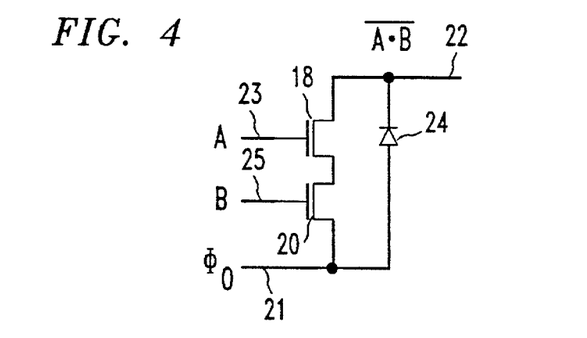
FIG. 4 is a schematic diagram of an adiabatic dynamic NAND gate in accordance with this invention.

FIG. 4 illustrates a representative NAND gate constructed in accordance with the principles of this invention. The NAND gate comprises two series connected controllable switches in the form of n-channel FETs 18 and 20 across a clock node 21 and an output node 22. A precharge diode 24 is connected across the FETs 18 and 20. The circuit of FIG. 4 performs a NAND operation on two input signals A and B directed to respective input nodes 23 and 25 connected to the control terminals of the FETs 18 and 20. The result of this logical operation appears on the output terminal 22. Gates capable of performing the NAND operation for more than two input signals A and B may be constructed by providing additional controllable switches in series with the two controllable switches 18 and 20 shown in FIG. 1. Each input involved in the NAND operation is directed to a respective input node and corresponding control terminal of each of the controllable switches. Although the NAND gate of FIG. 4 is shown to involve n-channel FETs, a corresponding NAND gate using p-channel FETs may be readily constructed by those skilled in the art. Also, other kinds of controllable switches may be used, including NPN and PNP bipolar transistors and the like.

Figure 5:
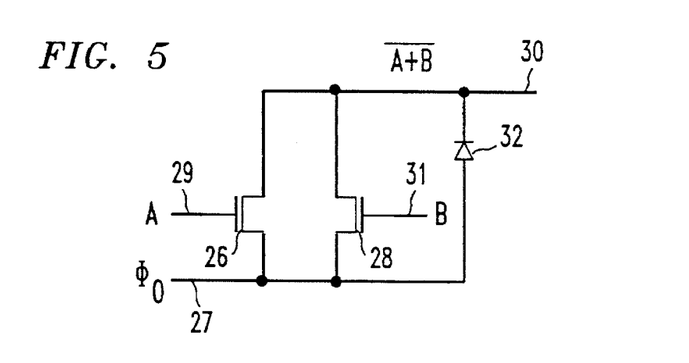
FIG. 5 is a schematic diagram of an adiabatic dynamic NOR gate in accordance with this invention.

FIG. 5 shows a representative NOR gate constructed in accordance with the principles of this invention. The NOR gate of FIG. 5 comprises a pair of parallel connected controllable switches, such as a pair of n-channel FETs 26 and 28, across a clock node 27 and an output node 30. A clock signal $\Phi_0$ similar to the clock signals in the circuitry of FIGS. 1, 1a, 3, and 4 is directed to the clock 27 node in FIG. 5. A diode 32 is connected across the parallel connected FETs 26 and 28 shown in FIG. 5. The circuit of FIG. 5 produces an output signal at node 30 which is a logical NOR of the two input signals A and B directed to respective input nodes 29 and 31 of the NOR gate in FIG. 5. Although the NOR gate of FIG. 5 uses n-channel devices, NOR gates using p-channel devices can be readily created. Other kinds of controllable switches may be used in place of the FETs 26 and 28, including NPN and PNP bipolar transistors and the like.

Figure 6:
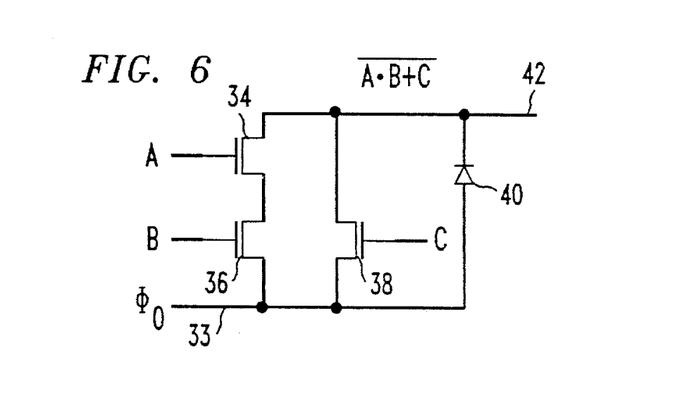
FIG. 6 is a schematic diagram of an adiabatic dynamic NAND/NOR gate in accordance with this invention.

FIG. 6 illustrates an adiabatic dynamic logic circuit in accordance with this invention which performs compound logical operations on a set of input signals A, B, and C. The circuit of FIG. 6 comprises two series connected n-channel FETs 34 and 36 in parallel with an n-channel FET 38. A diode 40 is connected in parallel with this combination of three FETs. A clock signal $\Phi_0$ is directed to a clock node 33. The clock signal $\Phi_0$ is similar to the clock signals directed to the clock nodes of the other logic circuits described above. The circuit of FIG. 6 produces an output signal at output node 42 which is the logical function $\overline{A.B+C}$ of the input signals A, B, and C applied to input nodes of the FIG. 6 device. A logic circuit using p-channel devices is possible in addition to the circuit of FIG. 6 which uses n-channel devices. Other controllable switches may be used in place of the FETs shown in FIG. 6.

FIG. 7 shows an example of a logic circuit using previously described adiabatic dynamic logic building blocks. The circuit of FIG. 7 comprises four inverter stages in series which may function as a shift register. The circuit of FIG. 7 has alternating n-channel and p-channel inverters. Stage 0 of the circuit shown in FIG. 7 is an n-channel inverter similar to the inverter shown in FIG. 1. It comprises an input node 44 connected to the control terminal of an n-channel FET 46. One output terminal of the FET 46 is connected to an output node 48 of the stage 0 inverter. Another output terminal of the FET 46 forms a clock node 50 connected to an energy source producing a clock signal $\Phi_0$ similar to the clock signal directed to the circuit of FIG. 1. This clock signal is depicted as the topmost waveform $\Phi_0$ shown in FIG. 8. A diode 52 similar to the diode 12 in FIG. 1 is connected between the clock node 50 and the output node 48.

The output node 48 of the stage 0 inverter is connected to an input node 54 of a p-channel inverter labeled stage 1 in FIG. 7. The input node 54 is connected to a control terminal of a p-channel FET 56 similar to the FET 14 shown in FIG. 3. One output terminal of the FET 56 is connected to an output node 58 of the stage 1 inverter. A clock node 60 is connected to another output terminal of the FET 56 and receives a clock signal $\Phi_1$ produced by an energy source. A diode 62 similar to the diode 16 in FIG. 3 is connected between the output node 58 and the clock node 60 in the stage 1 inverter. The clock signal $\Phi_1$ is similar to the clock signal for the p-channel inverter shown in FIG. 3 and is specifically shown in FIG. 8 as the waveform third from the top labeled $\Phi_1$. The clock signal $\Phi_1$ in this example of the invention is the inverse of the clock signal $\Phi_0$. This inversion is required by the fact that it is clocking an inverter using switching devices of a conductivity which is the opposite of the conductivity of the switching devices used in the stage 0 inverter. In addition to being the inverse of the clock signal $\Phi_0$, the clock signal $\Phi_1$ is delayed by one quarter clock cycle with respect to the clock signal $\Phi_0$.

Figure 8:
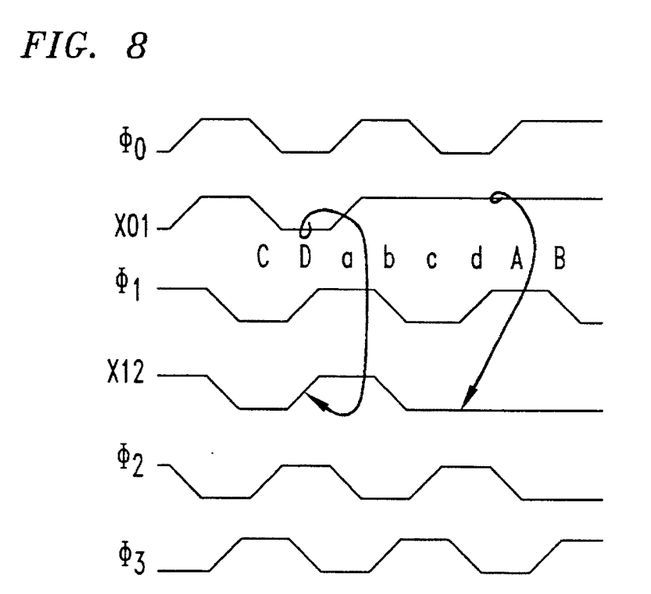
FIG. 8 is a timing diagram showing the clock voltages and interstage voltages for the multiple stage logic circuit shown in FIG. 7.

The output node 58 of the stage 1 inverter is connected to an input node 64 of an n-channel inverter labeled stage 2 in FIG. 7. The control terminal of an n-channel FET 66 is connected to the input node 64. One output terminal of the FET 66 is connected to an output node 68 of the stage 2 inverter. Another output terminal of the FET 66 is connected to a clock node 70 of the stage 2 inverter. A diode 72 is connected between the output node 68 and the clock node 70 of the stage 2 inverter. A clock signal $\Phi_2$ shown in FIG. 8 is directed to the clock node 70 of the stage 2 inverter. The clock signal $\Phi_2$ is the inverse of the clock signal $\Phi_1$ delayed by one quarter clock cycle. (The clock signal $\Phi_2$ really is also the inverse of the clock signal $\Phi_0$).

The output node 68 of the stage 2 inverter is connected to an input node 74 of a p-channel inverter labeled stage 3 in FIG. 7. The stage 3 inverter comprises a p-channel FET 76, the control terminal of which is connected to the input node 74. One output terminal of the FET 76 is connected to an output node 78 of the stage 3 inverter. Another output terminal of the FET 76 is connected to a clock node 80 of the stage 3 inverter. A diode 82 is connected between the output terminal 78 and the clock terminal 80 of the stage 3 inverter. A clock signal $\Phi_3$ is directed to the clock node 80 of the stage 3 inverter. The details of the clock signal $\Phi_3$ are shown as the bottom most waveform in FIG. 8. The clock signal $\Phi_3$ is the inverse of the clock signal $\Phi_2$ delayed by one quarter clock cycle.

Although FIG. 8 shows that they are not connected, it should be pointed out that the output node 78 can be safely connected to the input node 44 of the stage 0 inverter.

Figure 9:
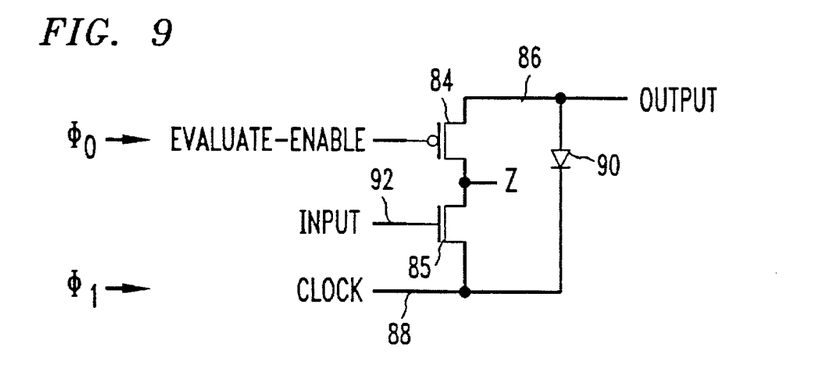
FIG. 9 is a schematic diagram of an adiabatic dynamic non-inverting gate in accordance with this invention.

In the gates which comprise the circuit of FIG. 7, there is no way to invert the voltage of an input signal without delaying that signal by one quarter clock cycle. There is also no way to delay the input signal without inverting its voltage. It would be desirable to have a given signal X which is valid and usable at the same time that its inverse $\overline{X}$ is valid and usable. This can be achieved by a noninverter circuit in accordance with the principles of this invention, as shown in FIG. 9. The noninverter comprises a p-channel evaluate-enable FET 84 in series with an n-channel evaluation transistor 85. One output terminal of the FET 84 is connected to an output node 86 of the noninverter. One terminal of the FET 85 is connected to the clock node 88 of the noninverter. The other two output terminals of the FETs 84 and 85 are connected together at a node labeled z. A diode 90 is connected from the output node 86 to the clock node 88 of the noninverter of FIG. 9. The diode 90 has the same polarity as the diode 16 in FIG. 3. The control terminal of the evaluate-enable FET 84 is connected to the clock signal $\Phi_0$ illustrated in FIG. 8. The input node 92 of the noninverter in FIG. 9 is connected to the control terminal of the evaluation FET 85. The previously described clock signal $\Phi_1$ is directed to the clock node 88 of the noninverter.

Figure 10:
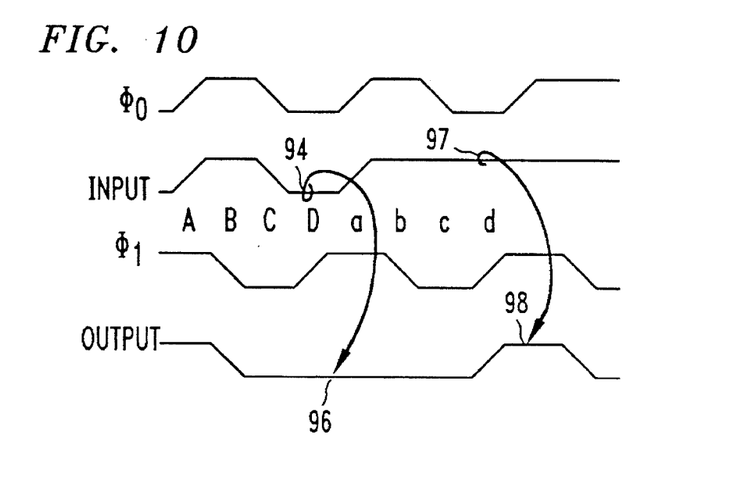
FIG. 10 is a timing diagram of the input signal, the output signal, and the two clock signals associated with the non-inverter of FIG. 9.

As illustrated by the timing diagram of FIG. 10, the noninverting gate stores a signal for one quarter of a clock cycle without inverting it. Compare the magnitude and times of occurrence for the portions of the input waveform and output waveform denoted by reference numerals 94 and 96 in FIG. 10. See also the relative magnitudes and time of occurrence for the portions of the input and output waveforms denoted by reference numerals 97 and 98 in FIG. 10. In each of these two cases, the magnitude of the output waveform is the same as the magnitude of the input waveform, but delayed by one quarter of a clock cycle. Compared with a corresponding gate in FIG. 7 (stage 1), the salient features of the noninverter shown in FIG. 9 are that the diode has the same polarity, the polarity of the evaluation transistor has been reversed, and there is an additional evaluate-enable transistor 84 in series with an evaluation transistor 85.

Figure 11:
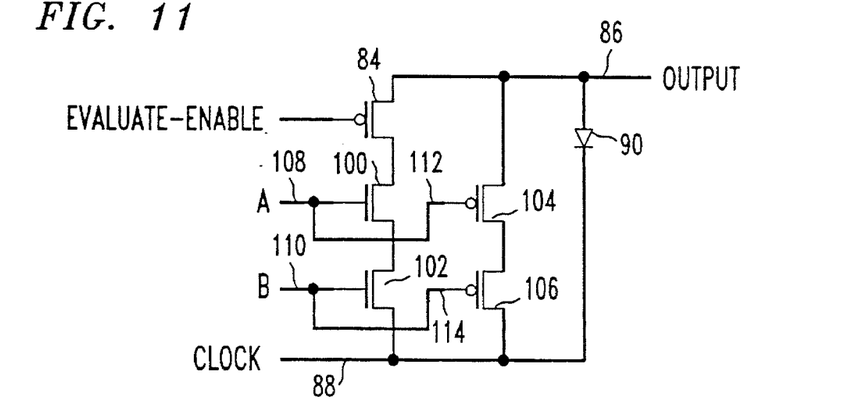
FIG. 11 is a schematic diagram of an adiabatic dynamic exclusive OR gate in accordance with the invention.

Noninverting gates such as the one shown in FIG. 9 can have multiple conjunctive inputs, multiple disjunctive inputs, and any combination of conjunctive and disjunctive inputs, just as the other gates described above can have. The noninverting logic gates may also have inverting inputs in addition to noninverting inputs. An important example of such a gate is an exclusive-or gate, an example of which is shown in FIG. 11. The exclusive-or gate shown in FIG. 11 comprises two n-channel evaluation FETs 100 and 102 in series with an evaluate-enable FET 84 like the one shown in FIG. 9. The exclusive-or gate of FIG. 11 also includes two series connected p-channel evaluation FETs 104 and 106 in parallel with the FETs 84, 100, and 102. A diode 90 like the diode in FIG. 9 is connected between the clock node 88 and the output node 86 of the exclusive-or gate shown in FIG. 11. As in FIG. 9, the control terminal of the transistor 84 is connected to a clock signal $\Phi_0$ and the clock node 88 is connected to another clock signal $\Phi_1$. Input nodes 108 and 110 are connected to control terminals of transistors 100 and 102, respectively; input nodes 112 and 114 are connected to control terminals of the transistors 104 and 106, respectively. An input signal A is connected to the input node 108 and the input node 112; an input signal B is connected to the input node 110 and the input node 112. The gate of FIG. 11 functions to perform an exclusive-or function on the input signals A and B. Specifically, the output signal at the output node 86 is the exclusive-or of the input signals A and B.

Figure 9A:
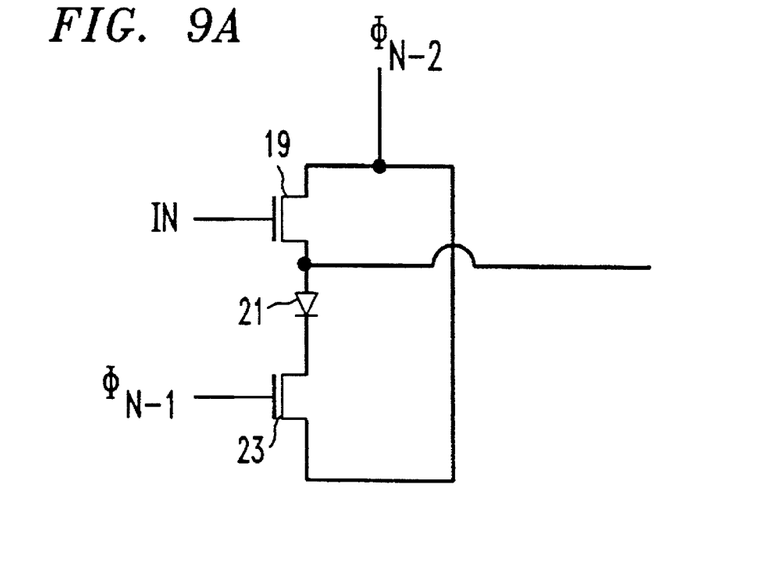
FIG. 9a is a schematic diagram of another adiabatic dynamic non-inverting gate in accordance with this invention.

FIG. 9a shows a second embodiment of a non-inverting gate in accordance with this invention. This noninverting gate corresponds to a stage N inverting gate in the string of inverting gates shown in FIG. 7. This noninverting gate comprises an N-channel transistor 19 in series with a diode 21 and a second N-channel transistor 23 connected between a clock node and an output node. An input node is connected to the control terminal of the first N-channel transistor 19. The control terminal of the second N-channel transistor 23 is connected to a clock signal $\Phi_{N-1}$ and the clock node is connected to another clock signal $\Phi_{N-2}$. Signals on the output node are a non-inverted version of signals on the input node. This non-inverter may have more dissipation than the non-inverter of FIG. 9 because the precharge phase of the FIG. 9a non-inverter may be more dissipative than the precharge phase of the FIG. 9 non-inverter.

Figure 11A:
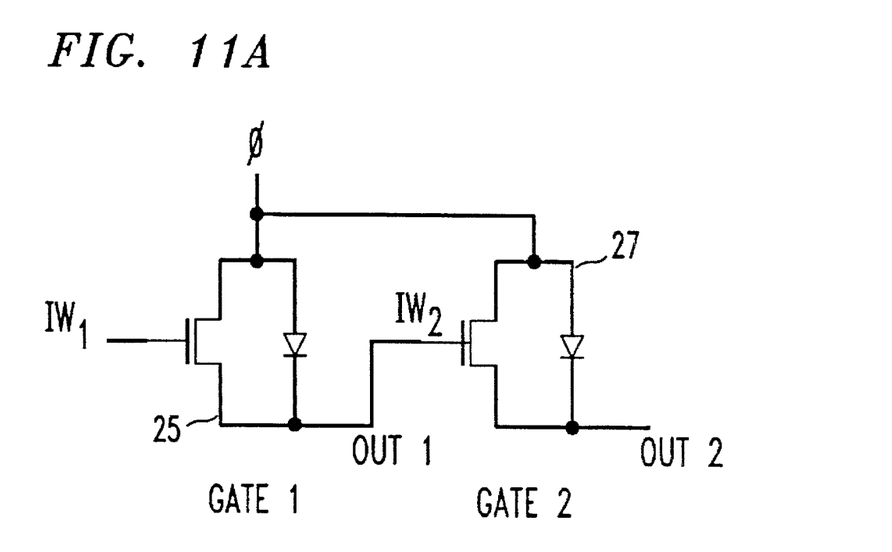
FIG. 11a is a schematic diagram of an adiabatic logic circuit in accordance with this invention having multiple gates driven by a single clock.

FIG. 7 shows a logic circuit with alternating n- and p-gates with only a single gate connected to each clock phase. In practice, however, more than one logic gate can be connected to each clock phase, for example, two logic gates can be connected to each phase. FIG. 11a shows an example of an n-type inverter 25 in series with another n-type inverter 27 driven by a single clock signal $\Phi$. An advantage of this structure is that it can be used as a non-inverting stage because the output of the n-type inverter 27 is a noninverted form of the input to the gate (IN1). This arrangement of cascaded gates connected to a single clock thus is an alternative to a separate noninverter requiring an additional clock phase.

Alternatively, the first gate directly connected to the input may be a complex gate such as a NAND gate followed by an inverter so that the output of the gate is an AND function of two or more inputs to the gate. Some things to keep in mind include the fact that each stage in arrangements such as the one shown in FIG. 11a causes a reduction in its output by an amount approximately equal to a diode threshold drop which may limit the number of cascaded stages which may be connected to a single clock. Also, if the output of the first stage lags behind the clock too far, the second stage may fail. This may cause the top speed of the circuit to be low compared to a single gate. In practice, however, this will not be a serious limitation.

Figure 12:
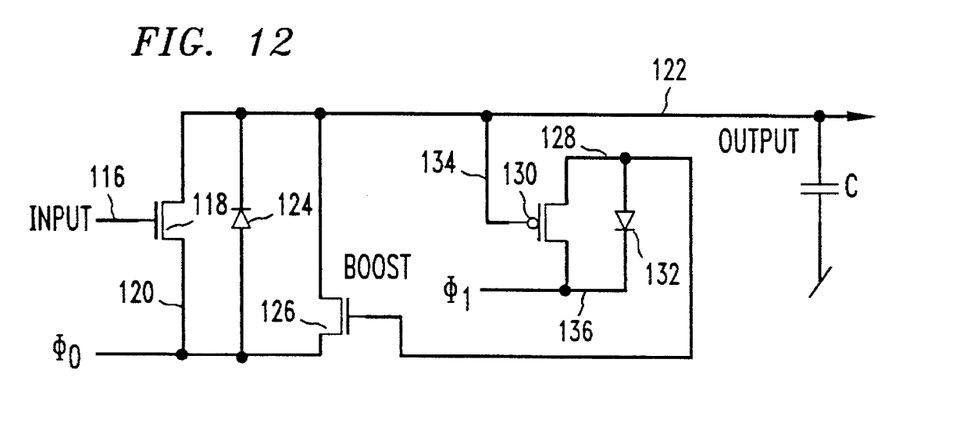
FIG. 12 is a schematic diagram of a line charger in accordance with this invention.
Figure 13:
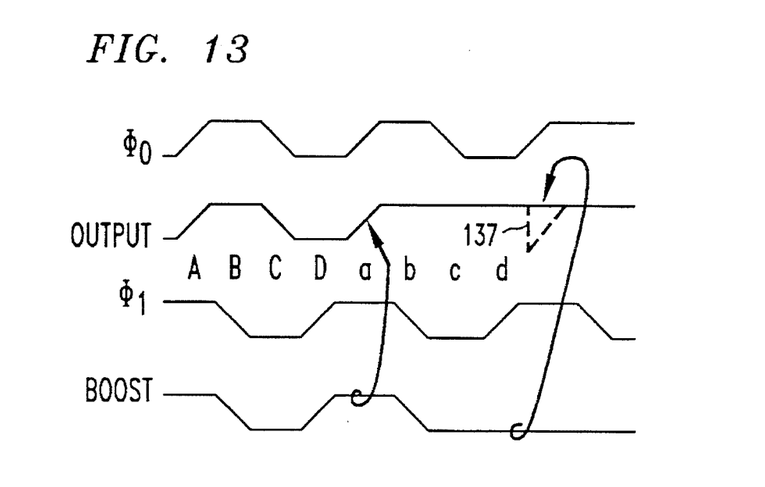
FIG. 13 is a timing diagram relating to the line charger shown in FIG. 12.

The basic logic gates described thus far suffer some energy loss in the precharge diodes due to the forward drop in the diode. Specifically, energy in an amount $CV\delta V$ is lost where $\delta V$ is the forward drop in the diode. In a logic gate which serves as a line driver, C can be quite large. Accordingly, an improvement shown in FIG. 12 has been developed. Voltage waveforms for the circuit of FIG. 12 are shown in FIG. 13. The circuit of FIG. 12 comprises an input node 116 connected to the control terminal of an n-channel FET 118. One output terminal of the transistor 118 is connected to a clock node 120 which receives a clock signal $\Phi_0$ as described above. The other output terminal of the transistor 118 is connected to an output node 122. A precharge diode 124 poled in the direction shown in FIG. 1 is connected between the clock node 120 and the output node 122. The circuit described thus far is the same as the basic inverting gate shown in FIG. 1. The circuit of FIG. 12 also includes a boost transistor which is designed to assist the precharge diode 124. In this example of the invention, the boost transistor is an n-channel FET 126 in parallel with the diode 124. The output terminals of the boost transistor 126 are connected between the clock node 120 and the output node 122. The control terminal of the boost transistor 126 is connected to the output node 128 of a p-channel inverting follower gate comprising a p-channel FET 130, the output terminals of which are connected to a diode 132. The input node 134 of this inverting gate is connected to the output node 122 and the clock node 136 is connected to a clock signal $\Phi_1$ shown in FIG. 13. The boost transistor 126 is arranged to be fully on when precharging through the diode 124 is needed, thus essentially shorting out the diode 124 and reducing energy dissipation through that diode. Then, if the clock $\Phi_0$ shown in FIG. 13 ramps up slowly enough and the devices are properly designed, there can be an arbitrarily small voltage drop across the precharge diode 124.

In this example, the boost transistor 126 may be controlled by a signal that is high if and only if the most recent output of the line driver of FIG. 12 was low. The needed signal is produced by the inverting gate clocked by $\Phi_1$ connected to the output of the line driver. During the precharge phase a in FIG. 13, if the line driver output on node 122 was low, the follower output 128 will be high and the boost transistor 126 will be fully turned on during most of the precharge phase. The boost process created by the transistor 126 will terminate when the output node 122 has been precharged within about one threshold drop of the rail. The precharge diode will then finish the job. The diode 124 is advantageous for maintaining a good output level if the output is high for an extended period of time. The boost transistor 126 should be turned on preferably only when it is really needed. If it were controlled by a data independent signal such as the clock $\Phi_1$, the boost transistor 126 would always turn on during phase A and perhaps earlier than that. This may be undesirable because it would cause the output node 122 which is already high to be connected to the clock signal $\Phi_0$ at a time when $\Phi_0$ is low. The output node 122 would then be discharged suddenly and non-adiabatically and then ramped back up when leaving it alone would have sufficed. The dotted waveform 137 in FIG. 13 indicates this scenario to be avoided. The follower gate also contains a precharge diode 132 of its own and, therefore, has a precharge dissipation of cVδV, where c is small, namely, just the gate capacitance of the boost transistor. This dissipation is a small price to pay since it allows the avoidance of dissipating an amount of energy equal to CVδV where C is a large load capacitance facing the line driver of FIG. 12.

Voltage margins for the logic family described in detail above are discussed below. The most marginal situation occurs during phase A in FIG. 8. In this situation, the output of stage 1 is in its low condition. The input is high and the $\Phi_1$ clock signal is also high. This is a crucial situation because the input voltage is one diode drop below the highest voltage achieved by the $\Phi_0$ clock signal. If this voltage is too low, for example, when the diode drop is too big, then the evaluation transistor 56 in stage 1 could start to turn on, jeopardizing the logic level of the stage 1 output. There are two general ways to deal with this. One scheme is to ensure that the forward drop of the precharge diodes is substantially less than the turn on threshold of the evaluation transistors. Another scheme is to make sure that the highest part of the $\Phi_0$ clock signal is higher than the highest part of the $\Phi_1$ clock signal. Similarly, the lowest part of the $\Phi_1$ clock signal must be below the lowest part of the $\Phi_2$ clock signal. This may increase the complexity of the clock generator circuit used with these logic elements. This situation could also limit the magnitude of tolerable inadvertent clock voltage excursions. There could be a problem, caused by ringing or other phenomena, if the high part of the $\Phi_1$ clock signal gets too high or if the low part of the $\Phi_0$ gets too low. Precharge diodes with low forward voltage drops are advantageous to solve voltage margin problems in addition to their advantages in reducing energy dissipation. Examples of such diodes used in conjunction with logic circuitry in accordance with this invention are shown in detail in FIG. 14.

Figure 14:
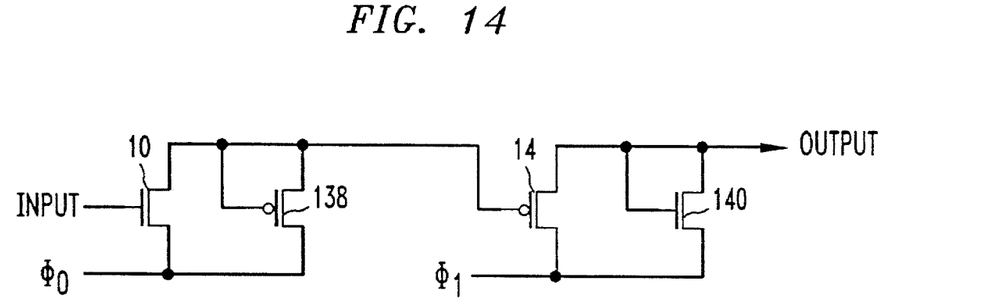
FIG. 14 is a schematic diagram of an n-channel inverter in series with a p-channel inverter showing of examples of precharge diodes useful with those inverters.

FIG. 14 shows an n-channel inverter in series with a p-channel inverter in accordance with this invention. It also shows examples of circuitry which could form the precharge diodes for these logic gates in accordance with the invention. Precharge diodes 138 and 140 can be implemented by means of FETs having their gates tied to one end of respective channels of the FETs as shown schematically in FIG. 14. It may be advantageous to dope the channels of such FET diodes 138 and 140 to reduce their threshold voltages relative to the evaluation transistors 10 and 14. In some instances, it may be better to implement the precharge diodes 138 and 140 in the form of pn junction diodes or in the form of Schottky diodes which may have less forward drop.

The outputs of ordinary non-adiabatic logic circuitry may be used to drive the inputs of adiabatic logic circuitry in accordance with this invention. In order for a logic gate in accordance with this invention to function adiabatically, input signal transitions should be constrained to occur during the "rest" phase of the clock signal, between the precharge and evaluate phases of the clock signal. As long as this situation is maintained, the slope of the input waveform does not much matter. Accordingly, to get from nonadiabatic logic to adiabatic logic, simply constrain the regular logic outputs which fed the inputs to adiabatic logic gates to make transitions only during the "rest" phase of the adiabatic logic clocks. The outputs of adiabatic logic circuitry in accordance with this invention may also drive the inputs of regular nonadiabatic circuitry. The output of an adiabatic logic block is only valid during the "hold" phase of the adiabatic logic clock. Accordingly, the regular logic being fed from the adiabatic logic should be constrained to only sample the output of the adiabatic logic during the "hold" phase of the clock. The constraints on regular non-adiabatic logic outputs and the sampling of the adiabatic logic outputs by non-adiabatic circuits can be achieved, for example, by means of conventional edge-triggered latch circuitry.

Although the logic circuitry described above is dynamic adiabatic logic, adiabatic logic in accordance with this invention may also use static logic signals provided those static logic signals are valid at appropriate times. Adiabatic logic in accordance with this invention may be used with conventional nonadiabatic logic circuitry because it is straightforward to convert adiabatic logic signals used by logic circuitry in accordance with this invention to conventional static or dynamic logic signals used by conventional logic circuitry. For example, this signal conversion may be made by a conventional latch triggered when an adiabatic signal produced by logic circuitry in accordance with this invention is valid. The existence of conventional circuitry on a chip along with adiabatic circuitry in accordance with this invention may require the use of a conventional sharp edged clock, but that clock need not be distributed to circuitry over the whole chip—only to the conventional part of the circuitry.

Although adiabatic logic in accordance with some examples of the invention may not be completely adiabatic or reversible in principle because of a device having a fundamentally irreversible dissipative component (for example, because of the dissipation in the diodes used in those examples), this logic in accordance with the invention is more nearly adiabatic in practice than most prior proposals for low power logic. In particular, ordinary CMOS circuitry is unnecessarily dissipative for several reasons. First, CMOS circuitry suffers from crowbar currents when both complementary transistors are partially in conduction at the same time during certain parts of CMOS operation. Second, CMOS circuitry uses signals which have such fast rise times that resistive losses are essentially equal to the stored energy so that no energy can be returned from the circuit nodes to the power supply. Reducing the rise times would make crowbar currents worse and would not help the stored energy situation anyway since circuit structures are not designed to remember the results of calculations if and when energy is being returned to the power supply. In adiabatic logic circuitry in accordance with this invention, however, the circuits cannot suffer from crowbar currents and significant energy recovery is possible. When the rise times of the clock signals used in circuitry in accordance with this invention are even modestly longer than a natural RC time constant of the chip, considerable energy recovery is achieved. Also, logic circuitry in accordance with this invention is extremely simple and compact.

Previous proposals for adiabatic logic gates required a rather large number of transistors per logic gate. This complicated circuitry will only be able to achieve meaningful power savings at very low operating frequencies. Adiabatic logic in accordance with this invention, however, involves no complexity penalty. This logic actually is simpler than competing nonadiabatic logic families as well as simpler than the prior adiabatic logic proposals. The adiabatic logic in accordance with this invention consumes less real estate and offers a lesser load to a clock driver. It outperforms standard dynamic logic even at very high operating frequencies.

To design a circuit in accordance with this invention so that there is the lowest possible energy usage, use minimum size transistors in the gates which will minimize the capacitance and the losses in the precharge diode. Then operate the chip with sufficiently slow clocks so that $I^2R$ losses are not excessive. The manufacturing process should be optimized to give the smallest feasible operation voltage V, diode drop $\delta V$, gate capacitance per unit area, and channel resistance per unit area.

One important aspect of logic gates in accordance with this invention, particularly the inverter shown in FIG. 1, is that a latching function is performed by those gates. The inverter not only functions to invert an input signal, but it also functions as a one bit dynamic latch. Similarly, the N-input NOR gate performs not only the NOR function but also the function of a one bit latch. For purposes of this discussion, the word latch refers to a circuit whose output remains valid for a positive length of time after the input or inputs to the latch have gone invalid. More precisely, a basic adiabatic dynamic logic gate in accordance with this invention is a half latch, since the output of the gate during the hold phase remains valid if the input goes inactive or remains valid; an input unexpectedly going active could invalidate the output. A full latch would tolerate inputs going invalid regardless of polarity. The term latch includes half latches and full latches. This definition is appropriate because the physics of computation tells us that logic operations (e.g., a NOR operation) can be undone (retracted) with zero dissipation in principle. If the input to a logic gate is no longer available, the latch operation cannot be retracted or erased without dissipating energy. The latch must be erased in a dissipative fashion. The previously described precharge diodes may be considered to be recharge diodes because their roles are not really to prepare for a succeeding operation, but rather to erase the result of a previous logic operation, thereby resetting a latch to its standard state. It is this resetting operation which is dissipative in principle. Since physics literature implies that logic is free and latches are expensive, it suggests that you should do as many logical operations as possible, latch the result, and then retract the logical operations. Conventional dynamic logic, which has a latch at every stage, would be the last thing one should use according to conventional wisdom. In this invention, there is a cheap latch so that it is convenient to latch the result from every logic gate. This leaves one free to retract the logic gates' inputs immediately. This, in turn, means that there is no need for complicated circuits to undo the logical operations. Accordingly, there is no need to store information in order to undo later the logical calculations. In this invention, there really is a cheap latch in contrast to conventional thinking which posits that latching is expensive. The latch involved in this invention takes substantially less than $CV^2$ per recharge. To put this in structural terms, there is a means for closing a switch to a latch node while there is minimal potential across the switch. To put it yet another way, latches are dissipative in principle. If you use the fundamental physical principles as a guide to the design of real devices, you will avoid latches because of their dissipative nature. The principle, however, involves 1 kT of dissipation—six orders of magnitude below current power*delay products. In this invention, there is a latch which is good in practice but flies in the face of the conventional wisdom.

In conclusion, the resulting logic family in accordance with this invention has vastly reduced switching energy (power×delay) and switching action (power×delay×delay). Logic gates in accordance with this invention are actually simpler than standard logic gates and can operate at surprisingly fast speeds, for example, up to 200 MHz and higher. These gates can be fabricated on absolutely standard processing lines. They are tolerant of timing skew and other imperfections in signal profiles and they regenerate logic levels at almost every stage.

I claim:

1. An invention, comprising:

an input node for receiving an input signal having first and second logical states and involving an adiabatic transition from one potential to another potential;

an output node for producing an output signal having the first and second logical states and involving an adiabatic transition from one potential to another potential;

a clock node for receiving a clock signal adiabatically varying between first and second potentials, the clock signal defining a charge period during which the clock signal changes from the first potential to the second potential and a discharge period when the clock signal changes from the second potential to the first potential; and means operative in response to said clock signal for discharging said output node from a rest state selectively as a function of the state of a signal carried by the input node and for thereafter recharging said output node to said rest state selectively as a substantially exclusive function of the state of a signal carried by said output node;

the input signal being substantially prevented from making transitions from one potential to another potential during a predetermined portion of the clock signal.

2. An invention, comprising:

an input node for receiving an input signal having first and second logical states and involving an adiabatic transition from one potential to another potential;

an output node for producing an output signal having the first and second logical states and involving an adiabatic transition from one potential to another potential;

a clock node for receiving a clock signal adiabatically varying between first and second potentials, the clock signal defining a charge period during which the clock signal changes from the first potential to the second potential and a discharge period when the clock signal changes from the second potential to the first potential; and means operative in response to said clock signal for selectively connecting said clock node to said output node and discharging said output node from a rest state selectively as a function of the state of the input node and for thereafter selectively connecting said clock node to said output node to recharge it to said rest state selectively as a substantially exclusive function of the state of said output node;

the input signal being substantially prevented from making transitions from one potential to another potential during a predetermined portion of the clock signal.

3. An apparatus, comprising:

an input node for receiving an input signal having one of a plurality of states and involving adiabatic transitions between the states;

an output node for producing an output signal having one of a plurality of states as a function of the state of the input signal, the output signal also involving adiabatic transitions between states;

a clock node for receiving a clock signal comprising a first state and a second state with a precharge transition from the first state to the second state at a first predetermined adiabatic rate of change and an evaluation transition from the second state to the first state at a second predetermined adiabatic rate of change; and a means for selectively adiabatically charging the output node during the precharge transition of the clock signal in response to the state of the output signal and for selectively adiabatically discharging the output node in response to the state of the input signal during the evaluation transition;

the input signal being substantially prevented from making transitions from one state to another state during a predetermined portion of the clock signal.

4. The circuit of claim 3, in which the means for selectively charging and discharging, comprises:

a circuit element between the input node and the output node which performs a logical function on the input signal to produce the output signal.

5. The circuit of claim 4, in which the logical function is a NOR function.

6. The circuit of claim 4, in which the logical function is a NAND function.

7. The circuit of claim 4, in which the logical function is a noninverting function.

8. The circuit of claim 4, in which the logical function is an AND function.

9. The circuit of claim 4, in which the logical function is an OR function.

10. The circuit of claim 4, in which the logical function is a compound logical function.

11. The electronic circuit of claim 3, in which the input signal, the output signal, and the clock signal have controllable rates of change between two respective states.

12. The adiabatic dynamic logic circuit of claim 3, in which the logic element comprises a controllable switch having a control terminal and first and second output terminals.

13. The adiabatic dynamic logic circuit of claim 9, in which the clocking signal is connected to at least one of the first and second output terminals of the controllable switch.

14. The adiabatic dynamic logic circuit of claim 3, in which the apparatus defines a series resistance capacitance circuit defining an RC time constant and the transitions are such that at least one of the input signal, the output signal, and the clocking signal changes from one state to another state in an amount of time at least as great as the RC time constant.

15. The adiabatic dynamic logic circuit of claim 11, in which the first and second rates of change are each such that the clocking signal changes between the first and second states in an amount of time at least as great as ten times the RC time constant.

16. An electronic circuit, comprising:

N input nodes for receiving input signals having one of two possible logic states and involving transitions between the two logic states;

at least one output node for producing output signals having one of the two possible logic states as a function of the states of the input signals;

a clock node for receiving clock signals comprising a substantially constant voltage first state and a substantially constant voltage second state with a precharge transition from the first state to the second state at a first predetermined adiabatic voltage rate of change and an evaluation transition from the second state to the first state at a second predetermined adiabatic voltage rate of change; and a means comprising no more than N+1 controllable switches between the N input ports and the at least one output port for selectively permitting current flow between the clock node and the output node for selectively charging the output node during the precharge transition of the clock signals in response to the state of the output signals and for selectively preventing current flow between the output node and the clock node to selectively prevent discharge of the output node in response to a predetermined state of the input signal during the evaluation transition;

the input signals being substantially prevented from making transitions from one state to another state during a predetermined a portion of the clock signals.

17. An electronic circuit, comprising:

N input nodes for receiving input signals having one of two possible logic states and involving transitions between the two logic states;

at least one output node for producing output signals having one of the two possible logic states as a function of the state of the input signals;

a clock node for receiving clock signals comprising a substantially constant voltage first state and a substantially constant voltage second state with a precharge transition from the first state to the second state at a first predetermined adiabatic voltage rate of change and an evaluation transition from the second state to the first state at a second predetermined adiabatic voltage rate of change; and a means comprising no more than N controllable switches and a rectifier between the N input ports and the at least one output port for selectively permitting current flow between the clock node and the output node for selectively charging the output node during the precharge transition of the clock signals in response to the state of the output signals and for selectively preventing current flow between the output node and the clock node to selectively prevent discharge of the output node in response to a predetermined state of the input signals during the evaluation transition;

the input signals being substantially prevented from making transitions from one state to another state during a predetermined portion of the clock signals.

18. An adiabatic dynamic logic circuit, comprising:

a switching element having a control terminal, a first output terminal, and a second output terminal;

the control terminal carrying an input signal having two possible logic states, a first logic state comprising a substantially constant level signal and a second logic state comprising a string of pulses, the input signal being constrained to change between the potential levels in an adiabatic fashion;

one of the first and second output terminals carrying an output signal having the two logic states, the output signal being constrained to change between potential levels in an adiabatic fashion; and an energy source for adiabatically clocking at least one of the terminals of the switching element.

19. An electronic circuit, comprising:

a transistor having a control terminal, an output terminal, and a clock terminal;

the control terminal of the transistor carrying an input signal having one of a plurality of potentials and the output terminal carrying an output signal having one of a plurality of potentials as a function of the potential of the input signal;

the clock terminal of the transistor carrying a clock signal adiabatically varying between a first state and a second state, the input signal being prevented from changing between the two potentials during predetermined portions of the clock signal; and a rectification means connected between the output terminal and the clock terminal for selectively charging the output terminal in response to a signal on the output terminal and selectively discharging the output terminal in response to a signal on the control terminal.

* * * * *